United States Patent [19]
Huang

[11] Patent Number: 6,107,131
[45] Date of Patent: Aug. 22, 2000

[54] METHOD OF FABRICATING INTERPOLY DIELECTRIC LAYER OF EMBEDDED DYNAMIC RANDOM ACCESS MEMORY

[75] Inventor: Keh-Ching Huang, Hsinchu, Taiwan

[73] Assignee: United Microelectronics Corp., Hsinchu, Taiwan

[21] Appl. No.: 09/073,981

[22] Filed: May 7, 1998

[30] Foreign Application Priority Data

Mar. 13, 1998 [TW] Taiwan ................................. 87103703

[51] Int. Cl.⁷ ............................................... H01L 21/8242
[52] U.S. Cl. ............................ 438/238; 438/253; 438/649
[58] Field of Search ..................................... 438/238–256, 438/381–399, 649, 682, 655

[56] References Cited

U.S. PATENT DOCUMENTS 5,808,335  9/1998  Sung ........................................ 257/306
5,858,831  1/1999  Sung ........................................ 438/241

Primary Examiner—Jey Tsai
Attorney, Agent, or Firm—Thomas, Kayden, Horstemeyer & Risley

[57] ABSTRACT

A method of fabricating an interpoly dielectric layer of an embedded DRAM wherein a substrate having a logic FET is provided and the logic FET has a source/drain region where a titanium suicide layer is formed thereon. An oxide layer is formed on the substrate and a silicion nitride layer is formed by PECVD on the oxide layer. The thermal stability can be improved because the formation of the compressive silicon nitride layer and the oxide layer prevents junction leakage, which is produced from the embedded DRAM.

13 Claims, 2 Drawing Sheets

METHOD OF FABRICATING INTERPOLY DIELECTRIC LAYER OF EMBEDDED DYNAMIC RANDOM ACCESS MEMORY

CROSS-REFERENCE TO RELATED APPLICATION

This application claims priority benefit of Taiwan application Serial no. 87103703, filed Mar. 13, 1998, the full disclosure of which is incorporated herein by reference.

BACKGROUND OF THE INVENTION

1. Field of the Invention

The invention relates to a method of fabricating an interpoly dielectric layer of embedded dynamic random access memory (Embedded DRAM), and more particularly to a method of fabricating an interpoly dielectric layer of embedded dynamic random access memory which can improve thermal stability of a titanium silicide layer.

2. Description of the Related Art

Dynamic random access memory is a kind of volatile memory and digital signal is determined by charge or discharge of a DRAM charge storage capacitor. Therefore, the data stored in the memory cell disappears completely when no power is supplied to the DRAM. The memory cell of a DRAM includes a field effect transistor (FET) and a capacitor. The capacitor is used for data storage in a DRAM memory cell. If more charges can be stored in the capacitor, the effect of disturbance becomes lower as the data storage is read by an amplifier.

Generally, logic devices include an inverter, an AND gate, an OR gate, a NAND gate and a NOR gate. A MOS transistor acts as a switch for operation of a logic device and either a logic one as "on" or zero as "off" is controlled by the gate of the MOS transistor.

The embedded DRAM of prior art comprises an embedded DRAM region and a logic circuit region. Referring to FIG. 1, device isolation structure 102 is formed on the substrate 100. An active region 104 having gate electrode 108 and wiring lines 110 and a logic device region 106 are then defined. The structure of gate electrode 108 is almost the same as that of the wiring lines 110. The major difference between the gate electrode 108 and the wiring lines 110 is that the gate electrode 108 and the substrate 100 are separated by the gate oxide layer 112 and the wiring line 110 is formed on the device isolation structure 102. The formation of capping oxide layer 116 protects the polysilicon layer 114. Capping oxide layer 116 is formed on the gate electrode 108 and the wiring lines 110 and oxide spacer 118 is formed on the either side of gate electrode 108 and wiring lines 110. Source/drain regions 120 are typically provided on either side of the gate electrode 108 to complete the transfer field effect transistor (FETs). An oxide layer 122 is formed on the substrate 100 and a lower capacitor electrode 124, a dielectric layer 126 and an upper capacitor electrode 128 are formed on the substrate 100 respectively.

The logic FET 130 is formed on the gate oxide layer 132 and the logic FET also includes the polysilicon gate electrode 134. A capping oxide layer 136 is still formed on the polysilicon gate electrode 134 and the oxide spacer 138 is formed to maintain the source/drain extension. Source/drain regions 120 are formed on the sides of the gate electrode 134 and a self-aligned salicide process is performed to form a titanium silicide layer 140 on the surface of source/drain region 120.

A planarization process is usually performed to the substrate 100 as the embedded DRAM is fabricated. BPSG 142, formed by chemical vapor deposition (CVD), is used to planarize the substrate 100. BPSG is a silicon oxide with some boron and phosphorus incorporated. In order to prevent boron and phosphorus from diffusing into source/drain region 120 during subsequent thermal process, it is necessary to use atmosphere pressure CVD (APCVD) to form an oxide layer 144 on the substrate 100 prior to the formation of BPSG.

Oxide/nitride/oxide (ONO) is always used as a dielectric layer 126 of capacitor in the current technologh when the embedded DRAM is fabricated. A furnace thermal process is necessary as the ONO is used as a dielectric layer. The thermal process described above exposes the chip to a high temperature. So the integrity of silicide 140 degrades as the high temperature process is performed and agglomeration of silicide in the logic circuit region 106 is produced at the interface of source/drain region 120 and the oxide layer 142, as shown in FIG. 2. The quality and the performance of devices are therefore affected.

In addition, the APCVD oxide layer 142 formed on the surface of the substrate 100 increases the contact aspect ratio. The contact etching process becomes more difficult.

SUMMARY OF THE INVENTION

It is therefore an object of the invention to provide an interpoly dielectric layer fabricated on the substrate. The formation of an interpoly dielectric layer not only improves the thermal stability of titanium silicide layer but also makes the process of fabricating a contact easier because the interpoly dielectric layer is thinner than before.

To achieve these objects and advantages, and in accordance with the purpose of the invention, as embodied and broadly described herein, the invention is directed towards a method of fabricating an interpoly dielectric layer of embedded dynamic random access memory (Embedded DRAM). A logic FET having source/drain region is formed on the substrate and a titanium silicide layer is formed on the source/drain region. An oxide layer is formed on the substrate and a silicon nitride layer is then formed on the oxide layer by plasma enhanced CVD (PECVD). The formation of compressive silicon nitride layer improves the thermal stability of the titanium silicide layer.

It is to be understood that both the foregoing general description and the following detailed description are exemplary and explanatory only and are not restrictive of the invention, as claimed.

DESCRIPTION OF THE PREFERRED EMBODIMENTS

Figure 1:
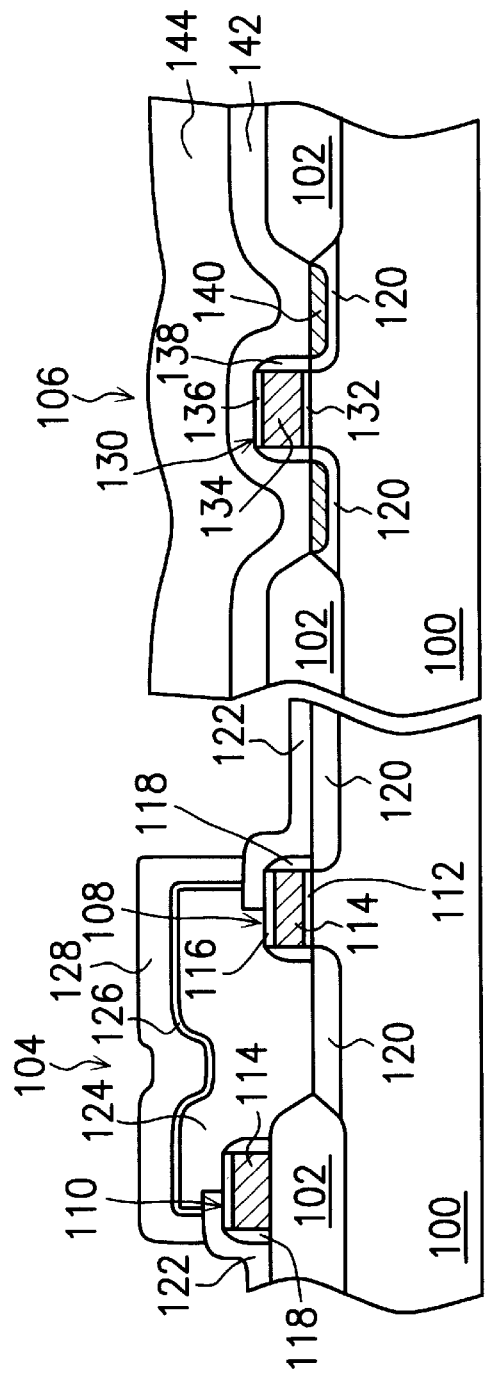
FIG. 1 is a cross sectional view of the conventional interpoly dielectric layer of embedded DRAM.
Figure 2:
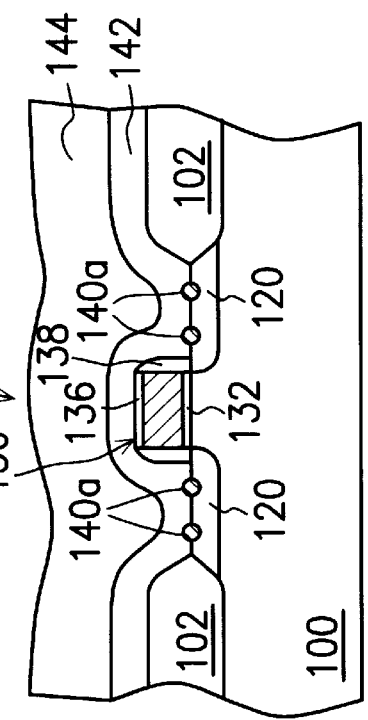
FIG. 2 is a cross sectional view of the conventional interpoly dielectric layer in the logic circuit region of embedded DRAM.
Figure 3A:
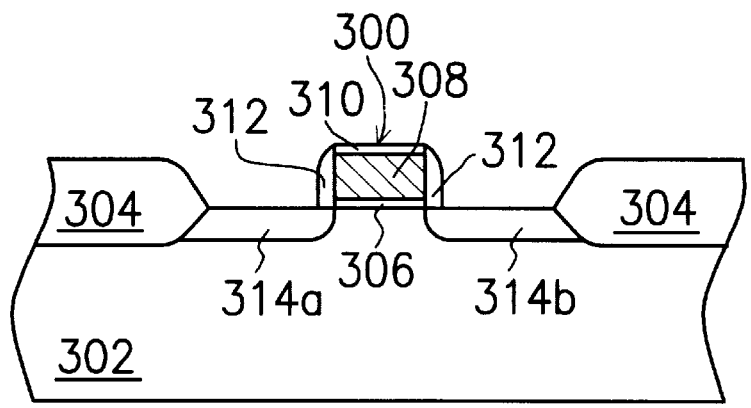
FIGS. 3A–3C is schematically illustrating processing steps in the formation of an interpoly dielectric layer of embedded DRAM in accordance with the preferred embodiments of the present invention.
Figure 3B:
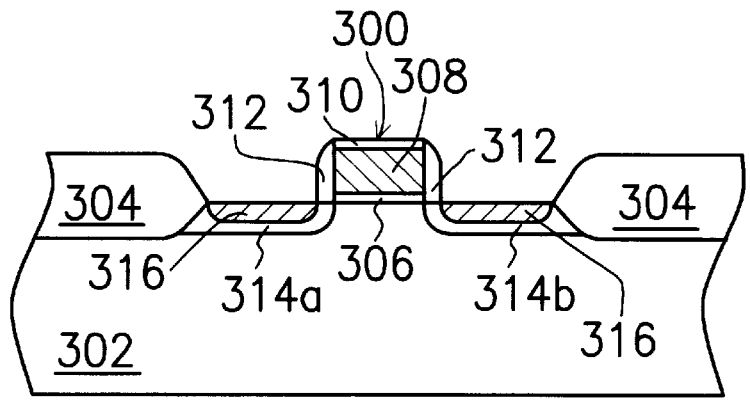
Figure 3C:
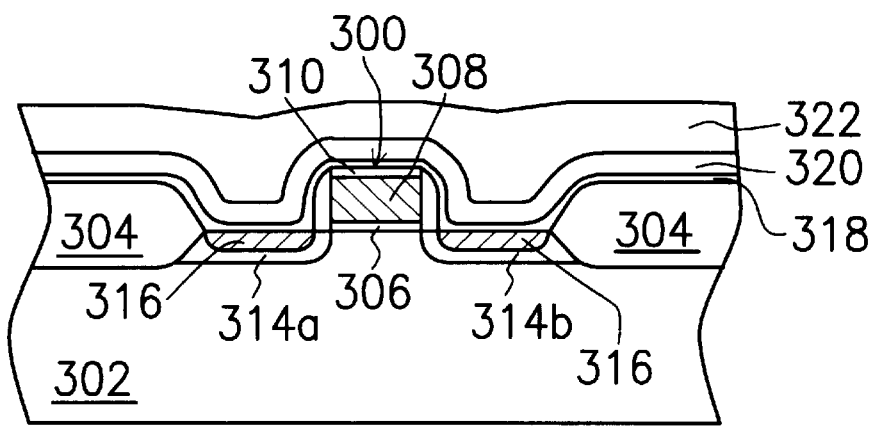

FIGS. 3A–3C is schematically illustrating processing steps in the formation of an interpoly dielectric layer of embedded DRAM in accordance with the preferred embodiments of the present invention.

Referring to FIG. 3A, the logic FET 300 is formed at the same time as the transfer FET of the embedded DRAM is formed. The differences between logic FET and transfer FET are the threshold adjust implantation, gate electrode doping levels and the source/drain region doping level. Because the DRAM of embedded DRAM is not the important point of this invention, its fabrication method is not described in detail As shown in FIG. 3A, the logic FET 300 is formed on the active area of the substrate 302 and the active area is defined by a device isolation structure 304 such as a field oxide layer or a shallow trench isolation structure. A gate oxide layer 306 is formed on the substrate 302 and a polysilicon layer with dopant is then formed. The polysilicon layer is defined and used as a gate electrode 308 of logic FET 300 and a capping oxide layer 310 is formed on the gate electrode 308 to protect gate electrode 308. Source/drain regions 314a, 314b are formed by first implanting a comparatively light dosage of N-type ions self-aligned to the gate electrode 308 prior to formation of the oxide spacer structure 312. The oxide spacer structure 312 is then provided by depositing a CVD oxide layer to a thickness of approximately 1000–2000 Å and etching back the oxide layer to form the spacer structure 312. A second implantation is then made self-aligned to the oxide spacer structure to complete the implantation of the source/drain regions 314a, 314b. Subsequent annealing activates the dopants in the source/drain 314a, 314b.

Referring to FIG. 3B, a salicide process is performed on the logic FET. The salicide process begins by first sputtering a layer of titanium over the surface of the devices to a thickness of, for example, 500 Å. This titanium layer is converted into titanium silicide at the exposed surface of source/drain 314a, 314b, in a two step annealing process. In the first process step, the device is subjected to a rapid thermal anneal (RTA) by heating the device to a temperature of up to about 700° C. for about thirty seconds. The first RTA process is followed by an etch to remove unreacted portions of the titanium layer, leaving behind the titanium silicide layer, and then the titanium silicide layer is further processed in a second RTA process to achieve a desired form of the titanium silicide layer 316.

After the initial RTA step, the surface of the device is subjected to a wet etch consisting of $H_2O_2$ and $NH_4OH$ diluted in water to remove unreacted titanium and a variety of undesired titanium compounds from the surface of the device. Most of the titanium silicide layer on the silicon surface in the first annealing step described above will be the relatively high resistivity metastable phase of titanium silicide, which does not have as low a resistivity as is desirable. It is accordingly desirable to expose the device to a second annealing step at a temperature of about 800° C. to convert the higher resistivity C-49 phase of the titanium silicide layer to the lower resistivity orthogonal phase (known as the C-54 phase) of the titanium silicide layer.

Referring to FIG. 3C, an oxide layer 318 to a thickness of about 100–200 Å is formed on the surface of the device having titanium silicide layer 316 formed thereon. Oxide layer 318 is formed by low pressure CVD. If TEOS is used as a source gas, the preferred thickness of the TEOS oxide layer 318 is about 200 Å. Plasma enhanced CVD (PECVD) is performed to form a silicon nitride layer 320 to a thickness of about 300–600 Å, its preferred thickness is about 600 Å. BPSG oxide layer 322 is then formed as an oxide dielectric layer.

The silicon nitride layer 320 formed by PECVD is used instead of the conventional oxide layer formed by APCVD, as describe above. Because of the formation of the compressive silicon nitride layer, the titanium suicide layer doesn't agglomerate as in the prior art, i.e., the titanium silicide layer has better thermal stability than before. For the BPSG oxide layer deposited in the subsequent process, it is not necessary for the silicon nitride layer to be thick since the silicon nitride layer is more capable of preventing impurity diffusion than the oxide layer. The TEOS oxide layer is provided prior to formation of the silicon nitride layer; it can release the stress from the silicon nitride layer to the substrate to prevent the junction leakage induced in the embedded DRAM. The thickness of silicon nitride layer is determined by the thermal process in the subsequent process or the thickness of titanium silicide layer. Generally, when the times and the reaction temperature of the thermal process increase, the thickness of silicon nitride layer will have to increase to prevent the dopant inside the BPSG oxide layer from diffusing into source/drain region. The thickness of the silicon nitride layer also increases as the thickness of the titanium silicide layer increases.

Because the total thickness of silicon nitride layer and the TEOS oxide layer in this invention is thinner than the oxide layer in the prior art, the aspect ratio of contact decreases. Contact opening process will be easier for this lower aspect ratio.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating an interpoly dielectric layer of an embedded DRAM, wherein a substrate having a logic FET is provided, the logic FET having a source/drain region and a titanium silicide layer formed on the surface of the source/drain region, wherein the method comprising:

forming an oxide layer over the substrate and the titanium silicide layer; and performing plasma enhanced chemical vapor deposition to form a silicon nitride layer on the oxide layer.

2. The method according to claim 1, wherein the oxide layer comprises a TEOS oxide layer.

3. The method according to claim 1, wherein the oxide layer is formed by low pressure chemical vapor deposition.

4. The method according to claim 1, wherein the thickness of the oxide layer is in a range of about 100–200 Å.

5. The method according to claim 1, wherein the thickness of the silicon nitride layer is in a range of about 300–600 Å.

6. The method according to claim 1, wherein the silicon nitride layer is a compressive silicon nitride layer.

7. The method according to claim 1, wherein the thickness of the oxide layer is about 200 Å.

8. The method according to claim 1, wherein the thickness of the silicon nitride layer is about 600 Å.

9. A method of fabricating an interpoly dielectric layer of an embedded DRAM, comprising:

provides a substrate having a logic FET, wherein the logic FET has a source/drain region and a silicide layer formed on the surface of the source/drain region;

forming a first oxide layer over the substrate and the silicide layer;

performing plasma enhanced chemical vapor deposition to form a silicon nitride layer on the first oxide layer; and forming a second oxide layer on the silicon nitride layer.

10. The method of claim 9, wherein the first oxide layer comprises a TEOS oxide layer.

11. The method according to claim 9, wherein the first oxide layer is formed by low pressure chemical vapor deposition.

12. The method according to claim 9, wherein the silicon nitride layer is a compressive silicon nitride layer.

13. The method of claim 9, wherein the second oxide layer comprises a BPSG oxide layer.

* * * * *